(12) United States Patent
Chen

(10) Patent No.: US 6,731,175 B1
(45) Date of Patent: May 4, 2004

(54) HIGH FREQUENCY AMPLIFIER

(75) Inventor: Yung-Hung Chen, Junghe (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/282,000

(22) Filed: Oct. 29, 2002

(51) Int. Cl.[7] ............................................... H03F 3/04
(52) U.S. Cl. ........................................ 330/311; 330/98
(58) Field of Search ................................. 330/311, 310, 330/98, 305, 306, 295, 124 R, 84

(56) References Cited

U.S. PATENT DOCUMENTS 6,496,074 B1 * 12/2002 Sowlati ....................... 330/311
6,509,799 B1 * 1/2003 Franca-Neto ................ 330/305
6,556,085 B2 * 4/2003 Kwon et al. ................. 330/311

* cited by examiner

*Primary Examiner*—Henry Choe
(74) *Attorney, Agent, or Firm*—Rabin & Berdo, P.C.

(57) ABSTRACT

A high frequency amplifier. The amplifier includes two transistors for signal amplification, and input and output matching circuits. There are variable capacitors and resistors in the matching input and output circuits. A received signal strength indicator receives the band-pass filtered intermediate-frequency signal and generates an indication signal corresponding to the amplitude of the received signal. The variable capacitors and resistors are tuned by the indication signal from the received signal strength indicator. Thus, the gain of the high frequency amplifier is automatically controlled.

12 Claims, 5 Drawing Sheets

HIGH FREQUENCY AMPLIFIER

BACKGROUND OF THE INVENTION

1. Field of the Invention

The present invention relates to a high frequency amplifier and particularly to a high frequency amplifier with variable capacitors and resistors in its input and output matching circuits, wherein the gain and frequency response can be automatically tuned to avoid the impact of impedance variation of the lead frame or resulting from the manufacturing process.

2. Description of the Prior Art

Wireless communication devices for different purposes, such as GSM or PHS mobile phones, use different transmission bands. Each of them includes a high frequency amplifier in its transmitter and receiver to amplify the signal in the transmission band used.

FIG. 1 is a diagram showing a conventional high frequency amplifier. It includes two transistors M1 and M2, a LC tank composed of an inductor Ld and a capacitor Cd, inductors Ls and Lg, and capacitors Cg and CL. The drain of the transistor M1 is connected to the source of the transistor M2. The gate of the transistor M1 is connected to receive a voltage VDD. The gate of the transistor M2 is connected to the inductor Lg and capacitor Cg connected in series. A signal IN is input to one end of the capacitor Cg. The inductor Ls is connected to the source of the transistor M1. The LC tank is connected to the drain of the transistor M2. The drain of the transistor M2 is connected to the capacitor CL and outputs a signal OUT.

The impedances of the capacitor Cg, inductors Lg and Ls, and the parasitic gate-to-source capacitor (not shown) of the transistor M1 are selected for input impedance matching. Only the signal IN having a resonant frequency formed by the input impedance of the high frequency amplifier is amplified. The gain of the high frequency amplifier is determined by the inductor Ld and capacitor Cd. The inductor Ls with a proper inductance will enhance the linear performance of the amplifier.

However, in a conventional high frequency amplifier, the impedances of the resistors, inductors and capacitors are not tunable after they are determined. Thus, impedance variation of the lead frame or resulting from the manufacturing process has serious impact on the input and output impedance of the high frequency amplifier. It-is difficult to have a conventional high frequency amplifier with a desired precise input and output impedance match.

SUMMARY OF THE INVENTION

The object of the present invention is to provide a high frequency amplifier with variable capacitors and resistors in its input and output matching circuits, wherein the gain and frequency response can be automatically tuned to the avoid impact of impedance variation of the lead frame or resulting from the manufacturing process.

The present invention provides a high frequency amplifier comprising a first and second transistor, the first transistor having a drain connected to a source of the second transistor and the second transistor having a gate connected to receive a first voltage, a first, second and third inductor, the first inductor having a first end connected to a gate of the first transistor, the second inductor having a first and second end respectively connected to a source of the first transistor and to receive a second voltage, and the third inductor having a first and second end respectively connected to a drain of the second transistor and to receive the first voltage, a first, second, third, fourth and fifth capacitor, the first capacitor having a first and second end respectively connected to a second end of the first inductor and to receive an input signal, the second capacitor having a first end connected to receive the second voltage, the third capacitor having a first end connected to receive the second voltage, the fourth capacitor having a first and second end respectively connected to the drain of the second transistor and to receive the first voltage, and the fifth capacitor having a first end connected to the drain of the second transistor, a first and second resistor, the first resistor having a first and second end respectively connected to a second end of the second capacitor and to receive the second voltage, and the second resistor having a first and second end respectively connected to a second end of the third capacitor and to receive the second voltage, a first and second variable capacitor, the first variable capacitor having a first and second end respectively connected to a second end of the second capacitor and a second end of the third capacitor, and the second variable capacitor having a first and second end respectively connected to a second end of the fifth capacitor and to output an output signal, a variable resistor having a first and second end respectively connected to the second end of the fifth capacitor and to receive the second voltage, and a received signal strength indicator receiving the output signal and generating an indication signal corresponding to an amplitude of the output signal, by which the first and second variable capacitor, and the variable resistor are tuned.

The present invention further provides a high frequency amplifier comprising a first and second transistor, the first transistor having a drain connected to a source of the second transistor and the second transistor having a gate connected to receive a first voltage, a first, second and third inductor, the first inductor having a first end connected to a gate of the first transistor, the second inductor having a first and second end respectively connected to a source of the first transistor and to receive a second voltage, and the third inductor having a first and second end respectively connected to a drain of the second transistor and to receive the first voltage, a first, second and third capacitor, the first capacitor having a first and second end respectively connected to a second end of the first inductor and to receive an input signal, the second capacitor having a first and second end respectively connected to the drain of the second transistor and to receive the first voltage, the third capacitor having a first end connected to the drain of the second transistor, a first and second variable capacitor, the first variable capacitor having a first and second end respectively connected to a second end of the second capacitor and a second end of the third capacitor, and the second variable capacitor having a first and second end respectively connected to a second end of the third capacitor and to output an output signal, a variable resistor having a first and second end respectively connected to the second end of the third capacitor and to receive the second voltage, and a received signal strength indicator receiving the output signal and generating an indication signal corresponding to an amplitude of the output signal, by which the first and second variable capacitor, and the variable resistor are tuned.

Thus, in the invention, there are varactors and variable resistors in the matching input and output circuits. A received signal strength indicator receives the band-pass filtered intermediate-frequency signal and generates an indication signal corresponding to the amplitude of the received signal. The variable capacitors and resistors are tuned by the indication signal from the received signal strength indicator. Thus, the gain of the high frequency amplifier is automatically controlled.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
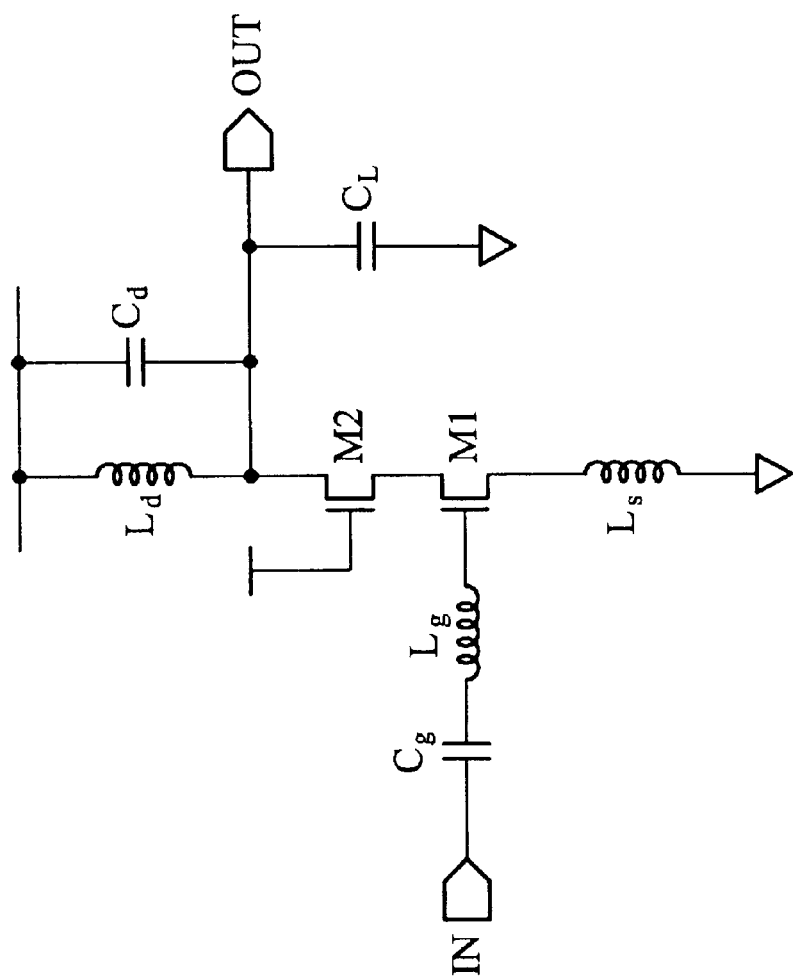
FIG. 1 is a diagram showing a conventional high frequency amplifier.
Figure 2:
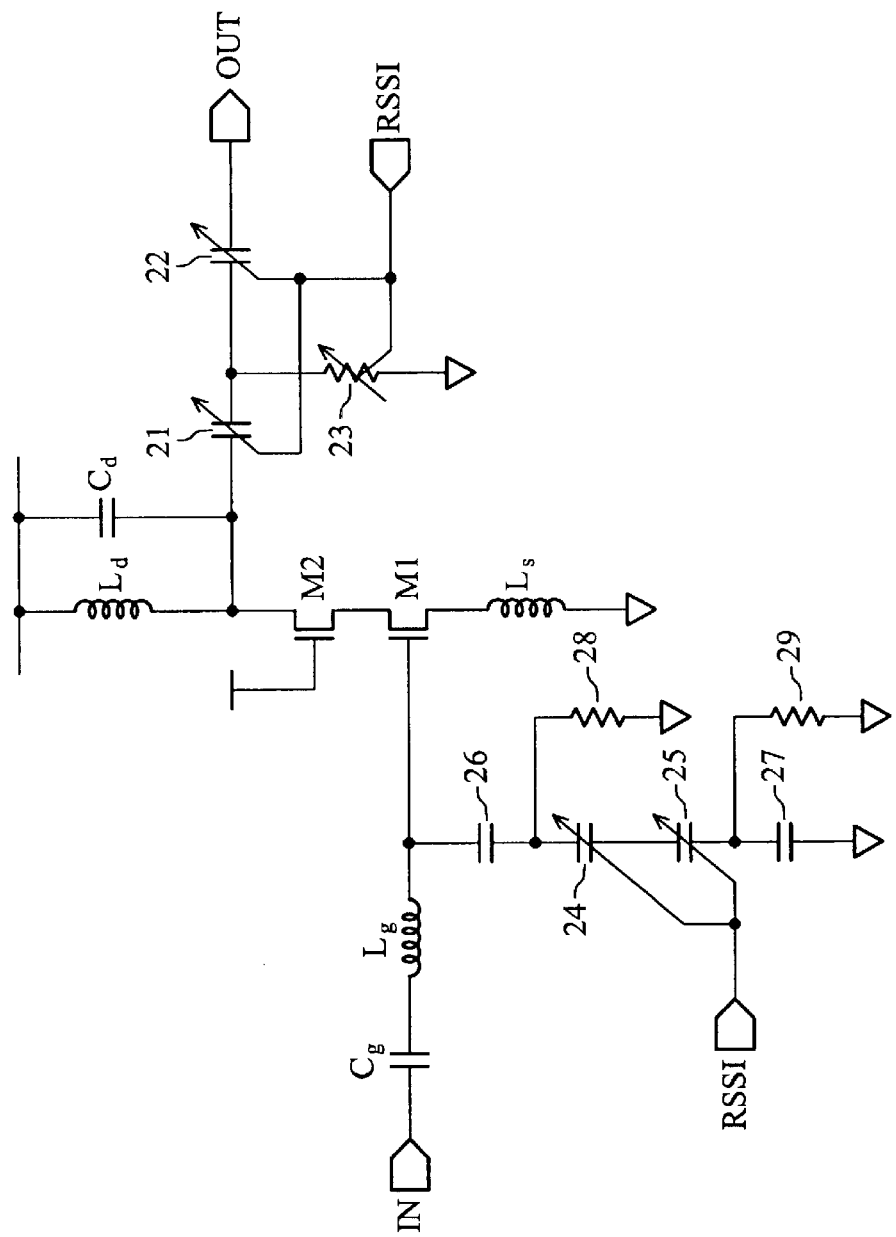
FIG. 2 is a diagram showing a high frequency amplifier according to a first embodiment of the invention.

FIG. 2 is a diagram showing a high frequency amplifier according to a first embodiment of the invention. It includes transistors M1 and M2, inductors Ld, Lg and Ls, capacitors Cd, Cg, 26 and 27, resistors 28 and 29, varactors 24, 25, 21 and 22, and variable resistor 23. The transistor M1 has a drain connected to a source of the transistor M2 and the transistor M2 has a gate connected to receive a voltage VDD. The inductor Lg has one end connected to a gate of the transistor M1. The inductor Ls has two ends respectively connected to a source of the transistor M1 and to receive a voltage Vss. The inductor Ld has two ends respectively connected to a drain of the transistor M2 and to receive the voltage VDD. The capacitor Cg has two ends respectively connected to one end of the inductor Lg and to receive an input signal IN. The capacitor 26 has one end connected to receive the voltage Vss. The capacitor 27 has one end connected to receive the voltage Vss. The capacitor Cd has two ends respectively connected to the drain of the transistor M2 and to receive the voltage VDD. The resistor 28 has two ends respectively connected to one end of the capacitor 26 and to receive the voltage Vss. The resistor 29 has two ends respectively connected to one end of the capacitor 27 and to receive the voltage Vss. The varactor 21 has one end connected to the drain of the transistor M2. The varactors 24 and 25 are connected in series between the capacitors 26 and 27. The varactor 22 has two ends respectively connected to one end of the varactor 21 and to output an output signal OUT. The variable resistor 23 has two ends respectively connected to one end of the varactor 21 and to receive the voltage Vss. A received signal strength indicator (not shown) receives the output signal and generates an indication signal RSSI corresponding to the amplitude of the output signal, by which all the varactors and variable resistors are tuned.

In the previously described amplifier, the gain of the amplifier can be controlled by tuning the variable resistor 23. Additionally, the variable resistor 23 is automatically tuned by the indication signal RSSI, which increases the dynamic range of the input signal IN.

Figure 3:
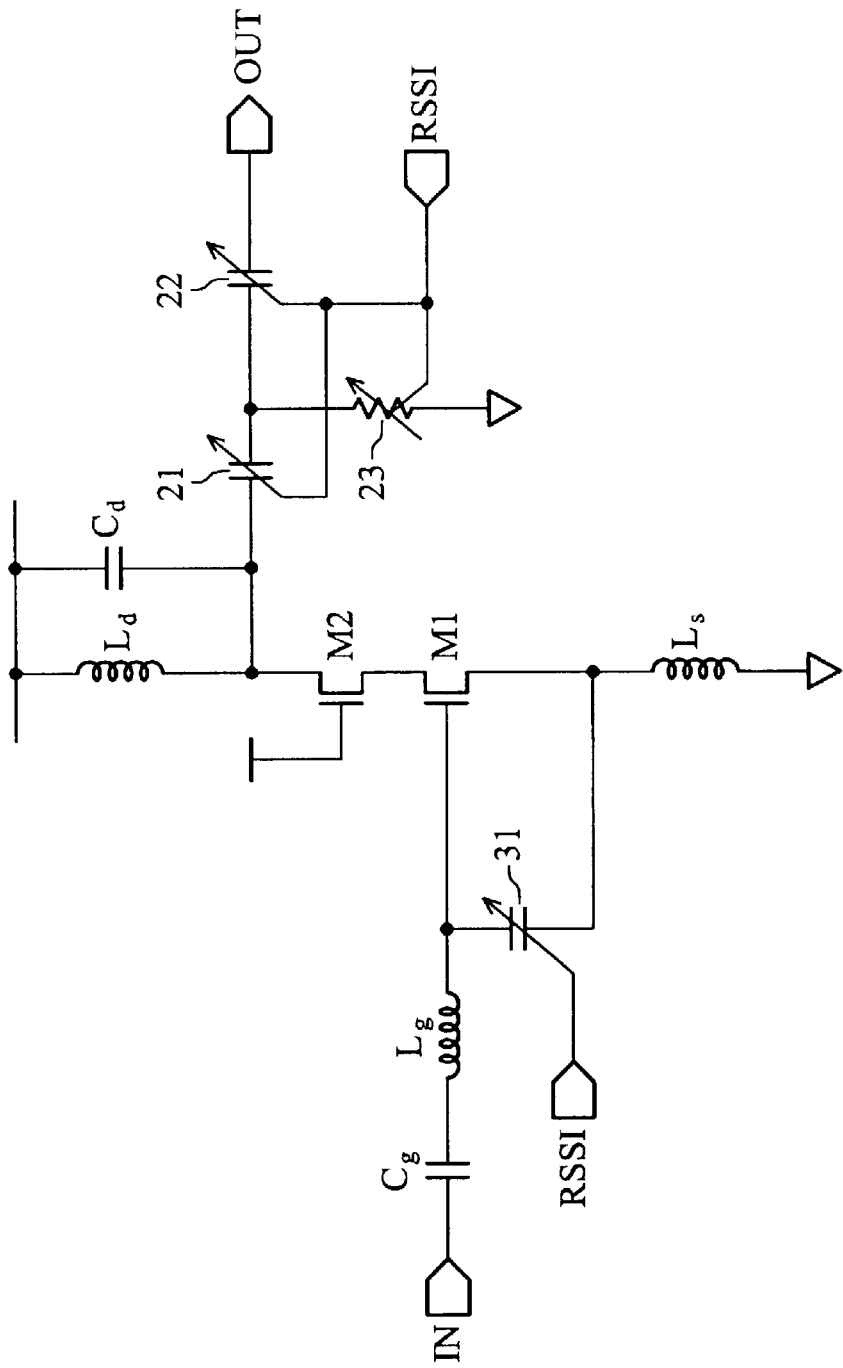
FIG. 3 is a diagram showing a high frequency amplifier according to a second embodiment of the invention.

FIG. 3 is a diagram showing a high frequency amplifier according to a second embodiment of the invention. The same elements in FIG. 2 and 3 refer to the same symbols for clarity. It includes transistors M1 and M2, inductors Ld, Lg and Ls, capacitors Cd and Cg, varactors 31, 21 and 22, and variable resistor 23. The transistor M1 has a drain connected to a source of the transistor M2 and the transistor M2 has a gate connected to receive a voltage VDD. The inductor Lg has one end connected to a gate of the transistor M1. The inductor Ls has two ends respectively connected to a source of the transistor M1 and to receive a voltage Vss. The inductor Ld has two ends respectively connected to a drain of the transistor M2 and to receive the voltage VDD. The capacitor Cg has two ends respectively connected to one end of the inductor Lg and to receive an input signal IN. The capacitor Cd has two ends respectively connected to the drain of the transistor M2 and to receive the voltage VDD. The varactor 21 has one end connected to the drain of the transistor M2. The varactor 31 is connected between the gate and source of the transistor M1. The varactor 22 has two ends respectively connected to one end of the varactor 21 and to output an output signal OUT. The variable resistor 23 has two ends respectively connected to one end of the varactor 21 and to receive the voltage Vss. A received signal strength indicator (not shown) receives the output signal and generates an indication signal RSSI corresponding to the amplitude of the output signal, by which all the varactors and variable resistors are tuned.

Figure 4:
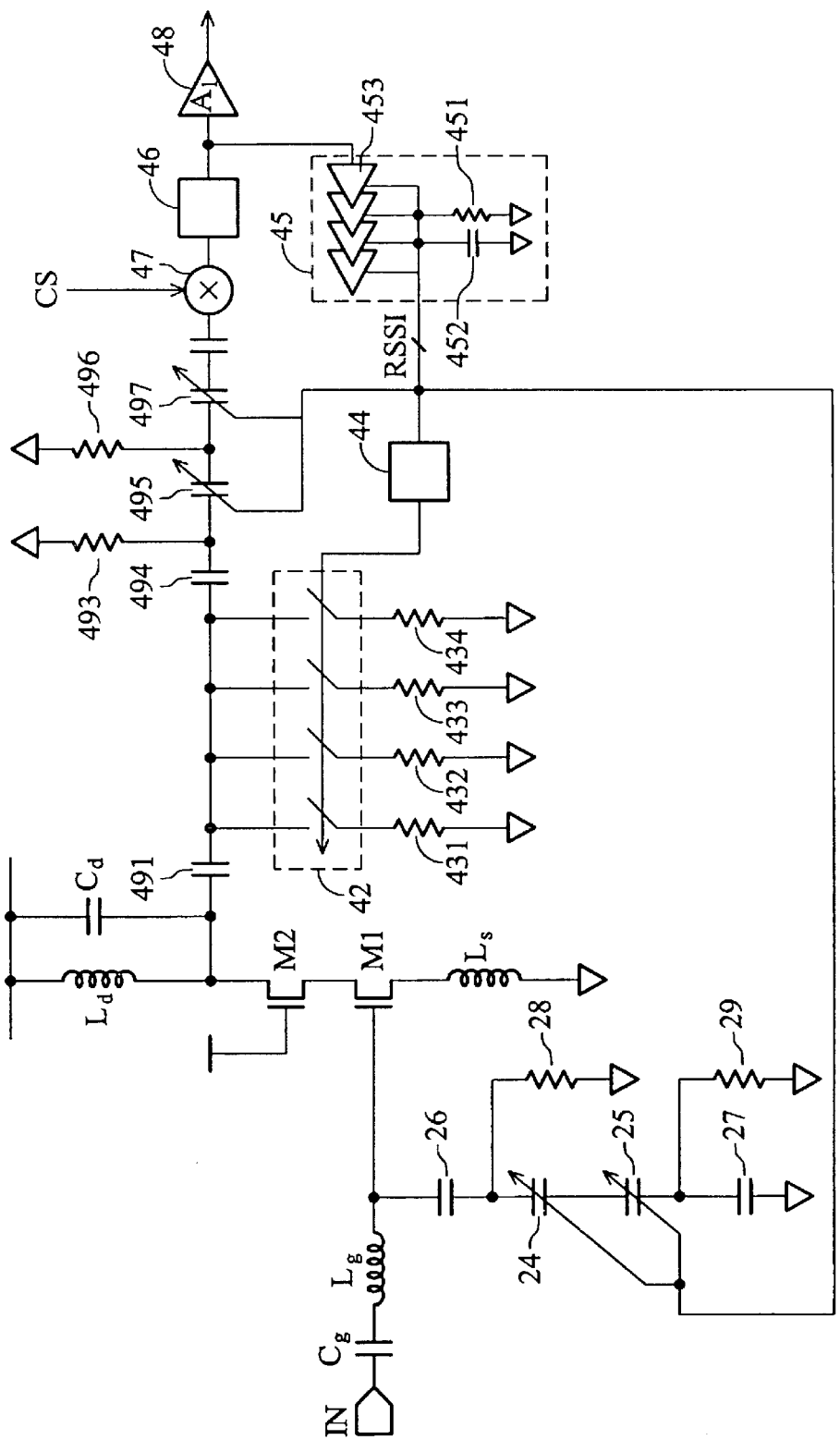
FIG. 4 is a diagram showing a high frequency amplifier according to a third embodiment of the invention.

FIG. 4 is a diagram showing a high frequency amplifier according to a third embodiment of the invention. The same elements in FIG. 2 and 4 refer to the same symbols for clarity. It includes transistors M1 and M2, inductors Ld, Lg and Ls, capacitors Cd, Cg, 26, 27, 491, 492, 497 and 452, resistors 28, 29, 431–434, 451, 493 and 496, varactors 24, 25, 494 and 495, a switch circuit 42, analog-to-digital converter 44, received signal strength indicator 45, band-pass filter 46, mixer 47, and amplifier 48. The transistor M1 has a drain connected to a source of the transistor M2 and the transistor M2 has a gate connected to receive a voltage VDD. The inductor Lg has one end connected to a gate of the transistor M1. The inductor Ls has two ends respectively connected to a source of the transistor M1 and to receive a voltage Vss. The inductor Ld has two ends respectively connected to a drain of the transistor M2 and to receive the voltage VDD. The capacitor Cg has two ends respectively connected to one end of the inductor Lg and to receive an input signal IN. The capacitor 26 has one end connected to receive the voltage Vss. The capacitor 27 has one end connected to receive the voltage Vss. The capacitor Cd has two ends respectively connected to the drain of the transistor M2 and to receive the voltage VDD. The resistor 28 has two ends respectively connected to one end of the capacitor 26 and to receive the voltage Vss. The resistor 29 has two ends respectively connected to one end of the capacitor 27 and to receive the voltage Vss. The varactors 24 and 25 are connected in series between the capacitors 26 and 27. The capacitor 492 has one end connected to the capacitor 491. The resistor 493 has two ends respectively connected to the capacitor 492 and to receive the voltage Vss. The resistor 496 has two ends respectively connected to the capacitor 497 and to receive the voltage Vss. The mixer 47 receives a carrier signal CS and mixes the carrier signal CS with the output signal OUT. The filter 46 band-pass filters the mixed signal from the mixer 47 and outputs the filtered signal to the received signal strength indicator 45. The received signal strength indicator 45 is a limiting amplifier composed of several amplifiers connected in series and operating with a RC circuit composed of the capacitor 452 and resistor 451. The received signal strength indicator 45 receives a signal and generates an indication signal RSSI corresponding to the amplitude of the received signal. The analog-to-digital converter 44 receives the analog indication signal and converts it into a digital signal. The digital indication signal is then output to the switch circuit 42. The switch circuit 42 comprises several switches. Each of the switches has one end connected to the capacitor 491 and controlled by the digital indication signal. Each of the resistors 431~434 has two ends respectively connected to a second end of one of the switches and to receive the voltage Vss.

Figure 5:
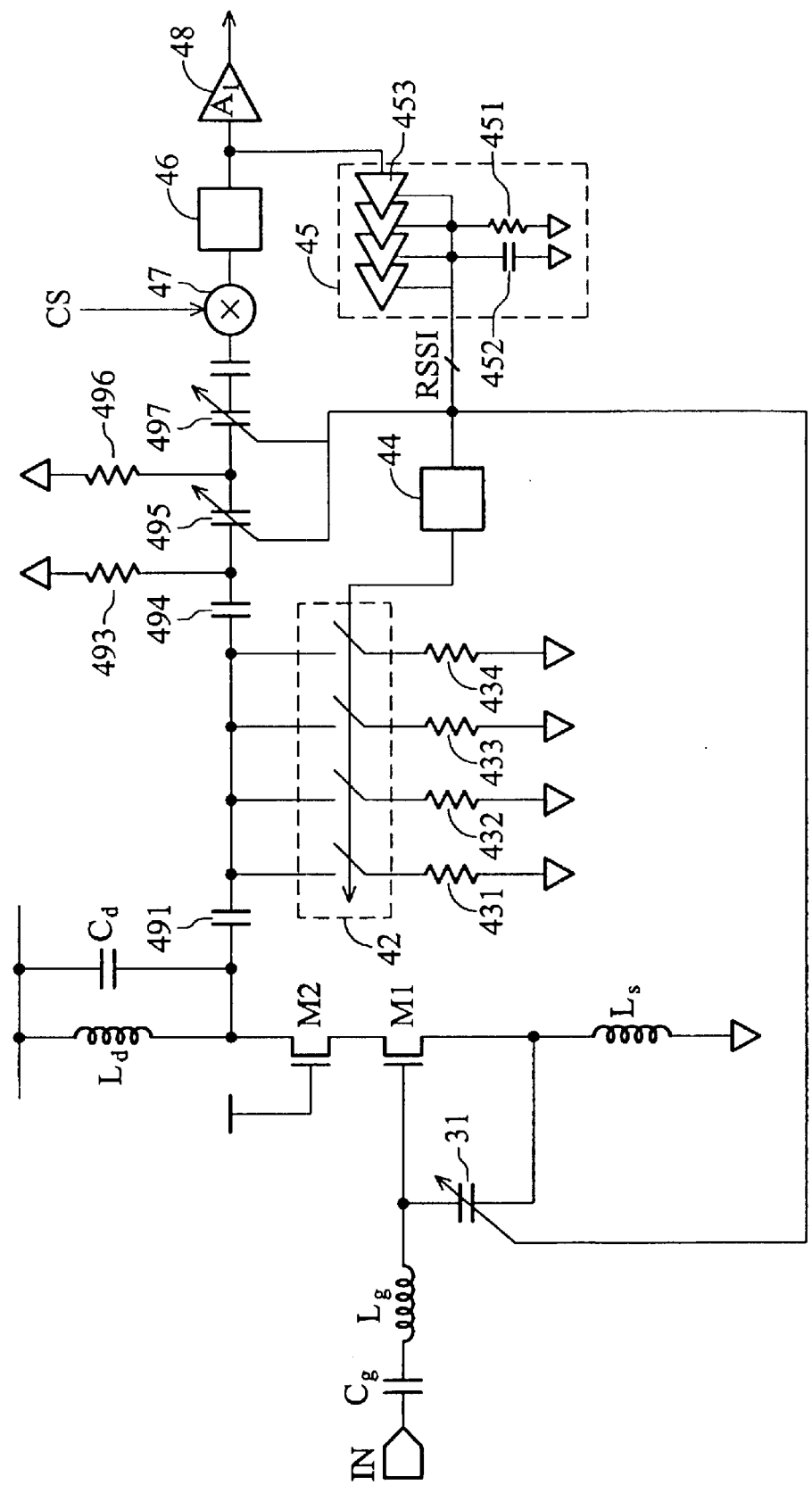
FIG. 5 is a diagram showing a high frequency amplifier according to a fourth embodiment of the invention.

FIG. 5 is a diagram showing a high frequency amplifier according to a fourth embodiment of the invention. The same elements in FIG. 3, 4 and 5 refer to the same symbols for clarity. It includes transistors M1 and M2, inductors Ld, Lg and Ls, capacitors Cd, Cg, 491, 492, 497 and 452, resistors 431~434, 451, 493 and 496, varactors 31, 494 and 495, a switch circuit 42, analog-to-digital converter 44, received signal strength indicator 45, band-pass filter 46, mixer 47, and amplifier 48. The transistor M1 has a drain connected to a source of the transistor M2 and the transistor M2 has a gate connected to receive a voltage VDD. The inductor Lg has one end connected to a gate of the transistor M1. The inductor Ls has two ends respectively connected to a source of the transistor M1 and to receive a voltage Vss. The inductor Ld has two ends respectively connected to a drain of the transistor M2 and to receive the voltage VDD. The capacitor Cg has two ends respectively connected to one end of the inductor Lg and to receive an input signal IN. The capacitor Cd has two ends respectively connected to the drain of the transistor M2 and to receive the voltage VDD. The varactors 31 are connected between the gate and source of the transistor M1. The capacitor 492 has one end connected to the capacitor 491. The resistor 493 has two ends respectively connected to the capacitor 492 and to receive the voltage Vss. The resistor 496 has two ends respectively connected to the capacitor 497 and to receive the voltage Vss. The mixer 47 receives a carrier signal CS and mixes the carrier signal CS with the output signal OUT. The filter 46 band-pass filters the mixed signal from the mixer 47 and outputs the filtered signal to the received signal strength indicator 45. The received signal strength indicator 45 is a limiting amplifier composed of several amplifiers connected in series and operating with a RC circuit composed of the capacitor 452 and 451. The received signal strength indicator 45 receives a signal and generates an indication signal RSSI corresponding to the-amplitude of the received signal. The analog-to-digital converter 44 receives the analog indication signal and converts it into a digital signal. The digital indication signal is then output to the switch circuit 42. The switch circuit 42 comprises several switches. Each of the switches has one end connected to the capacitor 491 and controlled by the digital indication signal. Each of the resistors 431~434 has two ends respectively connected to a second end of one of the switches and to receive the voltage Vss.

In conclusion, the present invention provides a high frequency amplifier with variable capacitors and resistors in its input and output matching circuits. A received signal strength indicator receives the band-pass filtered intermediate-frequency signal and generates an indication signal corresponding to the amplitude of the received signal. The variable capacitors and resistors are tuned by the indication signal from the received signal strength indicator. Thus, the gain and input and output impedance match can be automatically tuned to the avoid impact of impedance variation of the lead frame or resulting from the manufacturing process.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A high frequency amplifier comprising:
   a first and second transistor, the first transistor having a drain connected to a source of the second transistor and the second transistor having a gate connected to receive a first voltage;
   a first, second and third inductor, the first inductor having a first end connected to a gate of the first transistor, the second inductor having a first and second end respectively connected to a source of the first transistor and to receive a second voltage, and the third inductor having a first and second end respectively connected to a drain of the second transistor and to receive the first voltage;
   a first, second, third, fourth and fifth capacitor, the first capacitor having a first and second end respectively connected to a second end of the first inductor and to receive an input signal, the second capacitor having a first end connected to receive the second voltage, the third capacitor having a first end connected to receive the second voltage, the fourth capacitor having a first and second end respectively connected to the drain of the second transistor and to receive the first voltage, and the fifth capacitor having a first end connected to the drain of the second transistor;
   a first and second resistor, the first resistor having a first and second end respectively connected to a second end of the second capacitor and to receive the second voltage, and the second resistor having a first and second end respectively connected to a second end of the third capacitor and to receive the second voltage;
   a first and second variable capacitor, the first variable capacitor having a first and second end respectively connected to a second end of the second capacitor and a second end of the third capacitor, and the second variable capacitor having a first and second end respectively connected to a second end of the fifth capacitor and to output an output signal;
   a variable resistor having a first and second end respectively connected to the second end of the fifth capacitor and to receive the second voltage; and
   a received signal strength indicator receiving the output signal and generating an indication signal corresponding to an amplitude of the output signal, by which the first and second variable capacitor, and the variable resistor are tuned.

2. The high frequency amplifier as claimed in claim 1, wherein the first variable capacitor comprises a third and fourth variable capacitor connected in series.

3. The high frequency amplifier as claimed in claim 1, wherein the fifth capacitor is a variable capacitor tuned by the indication signal.

4. The high frequency amplifier as claimed in claim 1 further comprising:
   a sixth and seventh capacitor, the sixth capacitor having a first end connected to the second end of the fifth capacitor;

a third and fourth resistor, the third resistor having a first and second end respectively connected to a second end of the sixth capacitor and to receive the second voltage, and the fourth resistor having a first and second end respectively connected to a first end of the seventh capacitor and to receive the second voltage;

a mixer receiving a carrier signal and mixes the output signal with the carrier signal;

a filter band-pass filtering the output signal mixed with the carrier signal and outputting the filtered signal to the received signal strength indicator; and an analog-to-digital converter converting the analog indication signal to a digital indication signal.

5. The high frequency amplifier as claimed in claim 4, wherein the variable resistor comprises:

a plurality of switches, each of which has a first end connected to the second end of the fifth capacitor and controlled by the digital indication signal; and a plurality of resistors, each of which has a first and second end respectively connected to a second end of one of the switches and to receive the second voltage.

6. The high frequency amplifier as claimed in claim 1, wherein the received signal strength indicator comprises a plurality of limiting amplifiers.

7. A high frequency amplifier comprising:

a first and second transistor, the first transistor having a drain connected to a source of the second transistor and the second transistor having a gate connected to receive a first voltage;

a first, second and third inductor, the first inductor having a first end connected to a gate of the first transistor, the second inductor having a first and second end respectively connected to a source of the first transistor and to receive a second voltage, and the third inductor having a first and second end respectively connected to a drain of the second transistor and to receive the first voltage;

a first, second and third capacitor, the first capacitor having a first and second end respectively connected to a second end of the first inductor and to receive an input signal, the second capacitor having a first and second end respectively connected to the drain of the second transistor and to receive the first voltage, the third capacitor having a first end connected to the drain of the second transistor;

a first and second variable capacitor, the first variable capacitor having a first and second end respectively connected to a second end of the second capacitor and a second end of the third capacitor, and the second variable capacitor having a first and second end respectively connected to a second end of the third capacitor and to output an output signal;

a variable resistor having a first and second end respectively connected to the second end of the third capacitor and to receive the second voltage; and a received signal strength indicator receiving the output signal and generating an indication signal corresponding to an amplitude of the output signal, by which the first and second variable capacitor, and the variable resistor are tuned.

8. The high frequency amplifier as claimed in claim 7, wherein the first variable capacitor comprises a third and fourth variable capacitor connected in series.

9. The high frequency amplifier as claimed in claim 7, wherein the third capacitor is a variable capacitor tuned by the indication signal.

10. The high frequency amplifier as claimed in claim 7 further comprising:

a fourth and fifth capacitor, the fourth capacitor having a first end connected to the second end of the third capacitor;

a first and second resistor, the first resistor having a first and second end respectively connected to a second end of the fourth capacitor and to receive the second voltage, and the second resistor having a first and second end respectively connected to a first end of the fifth capacitor and to receive the second voltage;

a mixer receiving a carrier signal and mixes the output signal with the carrier signal;

a filter band-pass filtering the output signal mixed with the carrier signal and outputting the filtered signal to the received signal strength indicator; and an analog-to-digital converter converting the analog indication signal to a digital indication signal.

11. The high frequency amplifier as claimed in claim 10, wherein the variable resistor comprises:

a plurality of switches, each of which has a first end connected to the second end of the third capacitor and controlled by the digital indication signal; and a plurality of resistors, each of which has a first and second end respectively connected to a second end of one of the switches and to receive the second voltage.

12. The high frequency amplifier as claimed in claim 7, wherein the received signal strength indicator comprises a plurality of limiting amplifiers.

* * * * *